(12) United States Patent
Matsumoto

(10) Patent No.: US 6,249,011 B1
(45) Date of Patent: Jun. 19, 2001

(54) THIN FILM TRANSISTOR ARRAY WITH LIGHT SHIELD LAYER

(75) Inventor: Seiichi Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/513,925

(22) Filed: Feb. 28, 2000

(30) Foreign Application Priority Data

Feb. 26, 1999 (JP) .................................................. 11-050140

(51) Int. Cl.$^7$ ................................................. H01L 29/784
(52) U.S. Cl. ................................. 257/72; 257/59; 349/41; 349/110
(58) Field of Search ....................... 257/59, 72, 347–355; 349/41, 110

(56) References Cited

FOREIGN PATENT DOCUMENTS

| | | |
|---|---|---|
| 2-254419 | 10/1990 | (JP) . |
| 2-262125 | 10/1990 | (JP) . |
| 4-39628 | 2/1992 | (JP) . |
| 7-13197 | 1/1995 | (JP) . |
| 8-313933 | 11/1996 | (JP) . |
| 9-325354 | 12/1997 | (JP) . |

*Primary Examiner*—Fetsum Abraham
(74) *Attorney, Agent, or Firm*—McGinn & Gibb, PLLC

(57) ABSTRACT

In a thin film transistor array, on a transparent insulating substrate made of glass or the like, a plurality of scanning lines is formed of a first conductive film. A plurality of signal lines is formed of a second conductive film and pixel electrodes are formed on a gate insulating film in a region enclosed with adjacent scanning lines and adjacent signal lines. Thin film transistors are coupled to the pixel electrodes, and light shielding films are formed of the first conductive film and form light shielding overlap portions with peripheral portions facing the signal lines of respective pixel electrodes via the gate insulating film. The light shielding film has portions near the both ends thereof along the signal line projected toward a side of the signal line to form correction overlap portions which overlap the signal lines via the gate insulating film. This allows a correction of an interruption in the signal lines to be effectuated without increasing load to the process and without adversely affecting display.

7 Claims, 10 Drawing Sheets

THIN FILM TRANSISTOR ARRAY WITH LIGHT SHIELD LAYER

BACKGROUND OF THE INVENTION

1. Field of the Invention

The present invention relates to a thin film transistor array and, more particularly, to a thin film transistor array and a method for producing the same which allows for effectuating a correction of an interruption in signal metalization lines.

2. Description of the Related Art

One of the important factors in a thin film transistor array is to improve yield. In particular, only one interruption can make the thin film transistor array defective and thus it is important to reduce the occurrence of interruptions.

Furthermore, when comparing scanning lines with signal lines, since the scanning lines are formed on a transparent insulating substrate initially, they produce comparatively fewer interruptions. In contrast, when a gate insulating film underlying the signal lines is formed by means of plasma CVD or the like, foreign particles are captured in the gate insulating film at the time of forming and the foreign particles once captured are frequently not removed in subsequent processes such as in a washing process. Consequently, this causes irregularities to be formed on the gate insulating film and thus interruptions in the signal lines occur comparatively frequently.

Therefore, in particular, reducing interruptions in the signal lines is an important factor for improvement in yield.

For this purpose, a technique has been conventionally employed such that correction wirings are provided so as to enclose regions of pixel electrodes disposed in a matrix fashion on a thin film transistor array.

However, according to this conventional technique, since the correction wirings are formed so as to enclose the outside of a region in which a pixel electrode is disposed and thus wirings are longer compared with scan and signal lines, there is a problem in that the wirings have higher resistance.

Furthermore, there is another problem that in cases where a plurality of interruptions occurring in one line are corrected by using a correction wiring, a signal cannot be supplied to a portion in between the interruption points, resulting, finally, in an interruption.

Accordingly, for example, Japanese Laid-Open Patent Publication No. Hei-2-254419 discloses a technique for correcting interruptions in wirings by using light shielding films. FIG. 1 shows a plan view showing a matrix display device according to the publication.

Referring to FIG. 1, there are provided conductive light shielding films 21 with which the substantially entire surface of a substrate is covered except the central region of a pixel electrode 26. These conductive light shielding films 21 overlap with the peripheral portion of the pixel electrode 26, signal lines 24, and scanning lines 25 via an insulating film. Thus, in cases where an interruption occurs in scanning lines or signal lines, two portions overlapping between a wirings and conductive light shielding films 21 across the interruption point are irradiated with a laser beam to make the wirings and the conductive film 21 electrically continuous, thereby effectuating a correction of the interruption.

However, according to this conventional technique, there is a problem in that an additional load is imposed on the process and degradation in display quality is induced from the viewpoint of the production process of thin film transistors (TFT) and the display quality of the thin film transistor array.

That is, first, it is necessary to provide an additional step for forming the conductive light shielding films 21. The formation of the conductive light shielding films 21 requires a series of processes such as exposure or development in film formation or photolithography, leading to an increased load in the process and disadvantages in terms of cost and yield.

Furthermore, there is another problem in that large areas overlapping between the conductive light shielding films 21 and the signal lines 24, scanning lines 25, and the peripheral portion of the pixel electrode 26 via the insulating film create parasitic capacitance among the scanning lines 25, signal lines 24, pixel electrode 26, and the conductive light shielding films 21. That is, the higher the capacitance of the scanning lines 25 and the signal lines 24, the larger the time constant of the scanning lines 25 and the signal lines 24 becomes, resulting in heavily redundant scan signals or data signals.

For this reason, display is adversely affected such that electrical charge is insufficiently written into the pixel electrode 26 or written conditions become different in the pixel electrodes 26 that are coupled to the same wirings, depending on the distance from the input of signals.

Still furthermore, there is another problem that the capacitive coupling between the pixel electrode 26 and the signal lines 24 or the scanning lines 25 causes the potential of the pixel electrode 26 that holds a predetermined amount of electrical charge to be affected by a variation in the potential of signals inputted to the scanning lines 25 or signal lines 24 to result in being out of synchronization, leading to a defective display.

Moreover, Japanese Laid-Open Patent Publication No. Hei-9-325354 discloses a method for correcting an interruption by laser beam welding to connect a scanning line by bypassing the interruption point in the scanning line via an accumulative capacitance electrode.

SUMMARY OF THE INVENTION

The object of the present invention is to provide a thin film transistor array and a method for producing the same that allows for correcting an interruption in a signal line without increasing load to the process and adversely affecting display.

The thin film transistor array according to the present invention comprises, on a transparent insulating substrate comprised of glass or the like, a plurality of scanning lines formed of a first conductive film, a plurality of signal lines formed of a second conductive film, pixel electrodes formed on a gate insulating film in a region enclosed with adjacent scanning lines and adjacent signal lines, thin film transistors coupled to the pixel electrodes, and light shielding films forming light shielding overlap portions comprised of the first conductive film and overlapping with peripheral portions facing the signal lines of respective pixel electrodes via the gate insulating film. The light shielding film has portions near the both ends thereof along the signal line projected toward a side of the signal line to form correction overlap portions which overlap the signal lines via the gate insulating film.

Accordingly, in cases where an interruption occurs in the signal lines, the correction overlap portion between the light shielding film and the signal line across the interruption point is irradiated with a laser beam, thereby allowing for making the signal line and the light shielding film electrically continuous and thus effectuating a correction of the interruption.

A first effect of the present invention is that the yield of the products can be improved drastically by effectuating repairs of interruptions without increasing load to the process since the light shielding films formed of the first conductive film that forms scanning lines and the like require no additional process.

A second effect of the present invention is that degradation in display quality due to an increase in the time constant of wirings can be avoided since the correction of an interruption by laser irradiation can be effectuated with an area of the correction overlap portion of a few square micrometers, so that the areas of the correction overlap portions between the signal line and the light shielding film can be made smaller and thus the parasitic capacitance between the signal line and the pixel electrode can be made small.

A third effect of the present invention is that reduced parasitic capacitance between the signal line and the pixel electrode causes an influence of variation in the potential of data signals to decrease, for which the pixel electrode is to be subjected, and thus no degradation in display quantity occurs.

A fourth effect of the present invention is that an interruption can be corrected without an additional process, and since the gate insulating film and the protective film are stacked between the pixel electrode and the light shielding film, the thickness of films between both can be made thicker as well. This will reduce parasitic capacitance among the pixel electrodes, the light shielding film, and the signal line, and thus allow for reducing degradation in display quality and obtaining a excellent quality in display.

DESCRIPTION OF THE PREFERRED EMBODIMENTS

Figure 1:
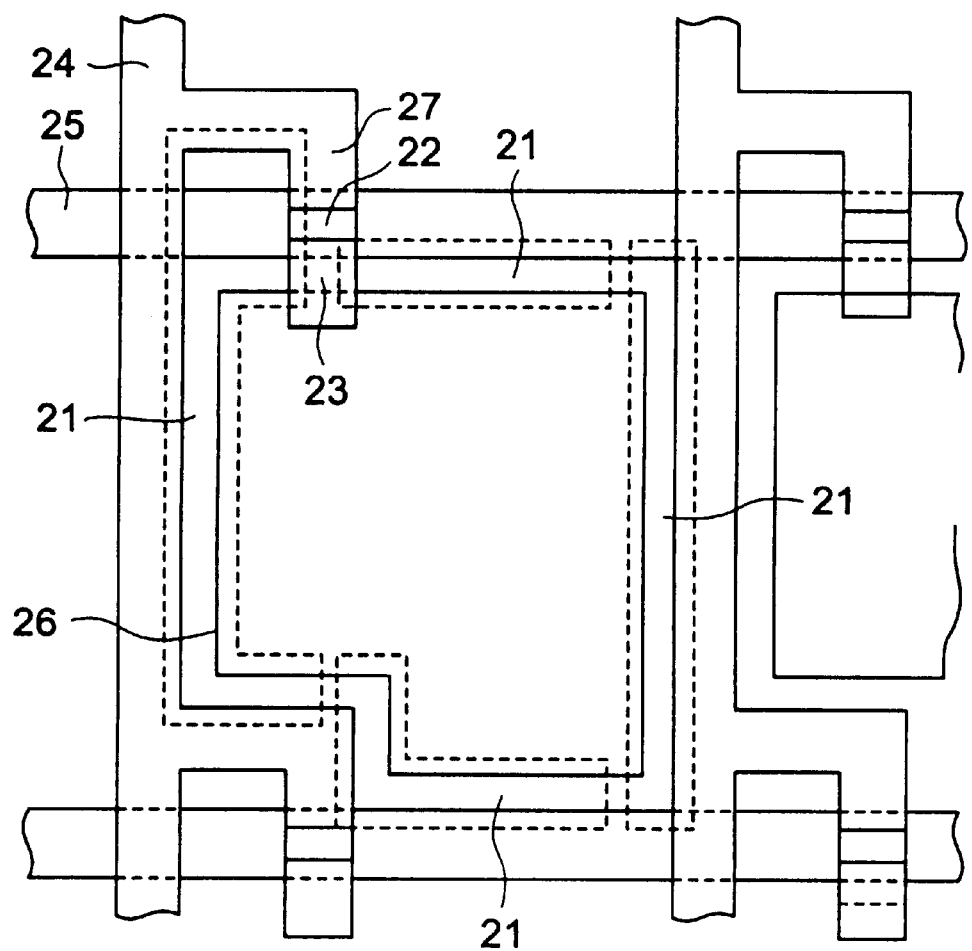
FIG. 1 is a plan view showing the configuration of a conventional thin film transistor array.
Figure 2:
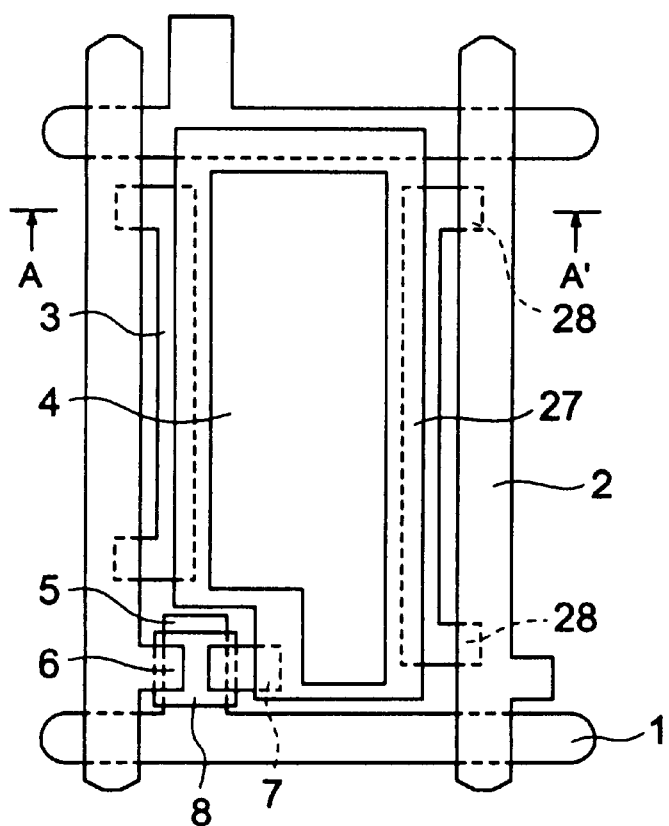
FIG. 2 is a plan view showing the configuration of a first embodiment of the present invention.
Figure 3:
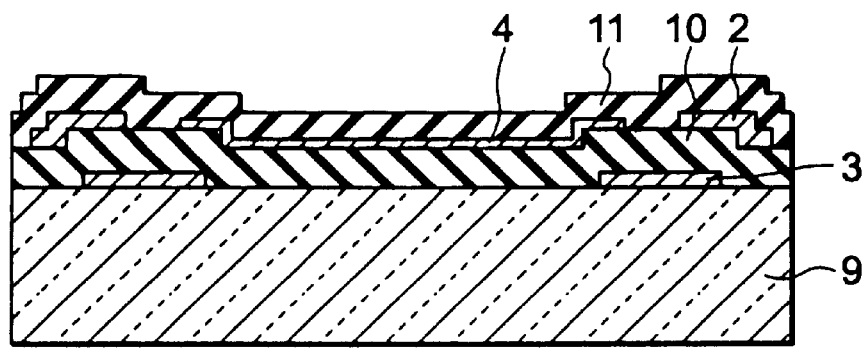
FIG. 3 is a cross-sectional view taken along line A–A' of FIG. 2.

The preferred embodiments of the present invention are to be explained below with reference to the attached drawings. FIG. 2 is a plan view showing the configuration of a first embodiment of the present invention. FIG. 3 is a cross-sectional view taken along line A–A' of FIG. 2.

Referring to FIG. 2 and FIG. 3, on a transparent insulating substrate 9 comprised of glass or the like, formed are a plurality of scanning lines 1 formed of a first conductive film, a plurality of signal lines 2 formed of a second conductive film, a pixel electrode 4 formed on a gate insulating film 10 in a region enclosed by adjacent scanning lines 1 and adjacent signal lines 2, a thin film transistor ("TFT") 8 coupled to the pixel electrode 4, and light shielding films 3 forming light shield overlap portions (see dimension OLP in FIG. 2 and FIG. 3) which overlap with peripheral portions 27, via the gate insulating film 10, facing to the signal lines 2, of each pixel electrode 4 comprised of the first conductive film.

Furthermore, in this first embodiment, the light shielding films 3 formed of the first conductive film forms light shield overlap portions which overlap with peripheral portions of the pixel electrode 4 facing the signal lines 2 via the gate insulating film 10; in the figure, the portions near the upper and lower ends of the light shielding film 3 are projected toward the signal line 2, thus forming correction overlap portions 28 (see also dimension OLS in FIG. 2 and FIG. 3) which overlap with the signal line 2 via the gate insulating film 10.

In such a configuration, in case of an interruption in the signal line 2, the correction overlap portions between the light shielding film 3 and the signal line 2 can be irradiated with a laser beam, thereby making the signal line 2 and the light shielding film 3 electrically continuous.

In the case of an occurrence of an interruption in the signal line 2, the overlap portions between the light shielding film 3 and the signal line 2 are irradiated with a laser beam to make both electrically continuous, thereby allowing for supplying data signals to the signal line 2 beyond the interruption and thus correcting the interruption of the signal line 2.

The role of the light shielding film 3 is to be explained in more detail. The light shielding film 3 has two roles: the role of improving the opening ratio of a thin film transistor and of correcting interruptions of the signal line 2.

Figure 13:
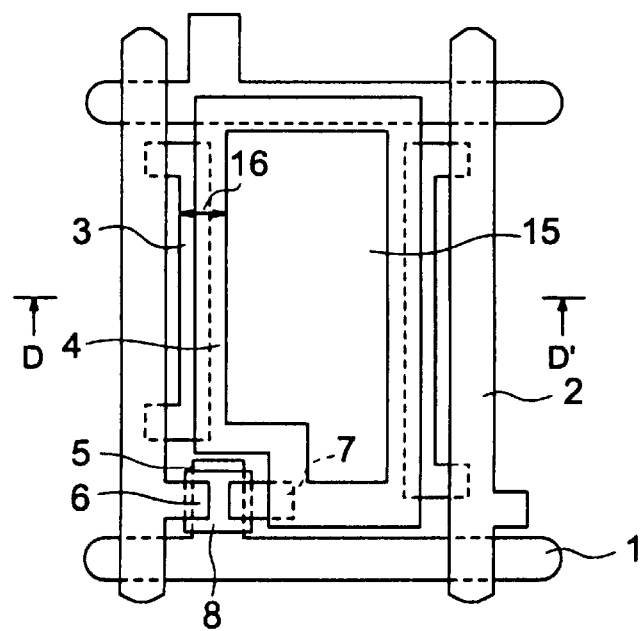
FIG. 13 is an explanatory plan view showing the role of a light shield film.
Figure 14:
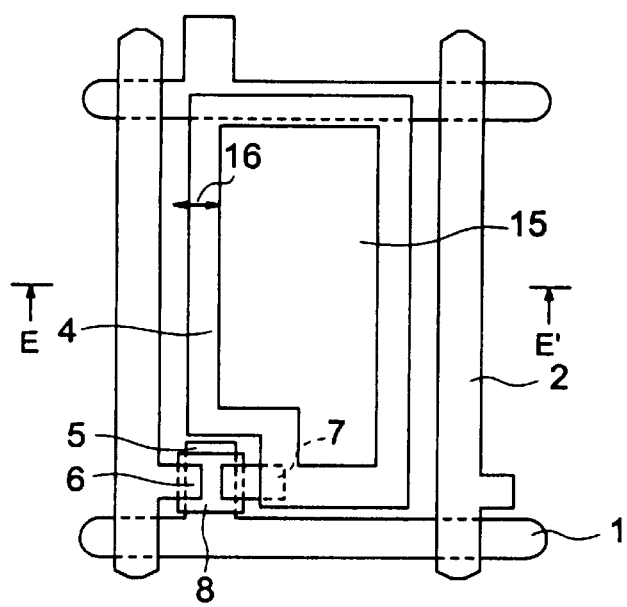
FIG. 14 is an explanatory plan view showing the role of a light shield film.

First, the role of improving the opening ratio is explained. FIG. 13 is a plan view with the light shielding film 3 formed; FIG. 14 shows a plan view without the light shielding film 3 formed. Moreover, FIG. 15 and FIG. 16 are cross-sectional views taken along line D–D' and line E–E' of FIG. 13 and FIG. 14, respectively.

Figure 15:
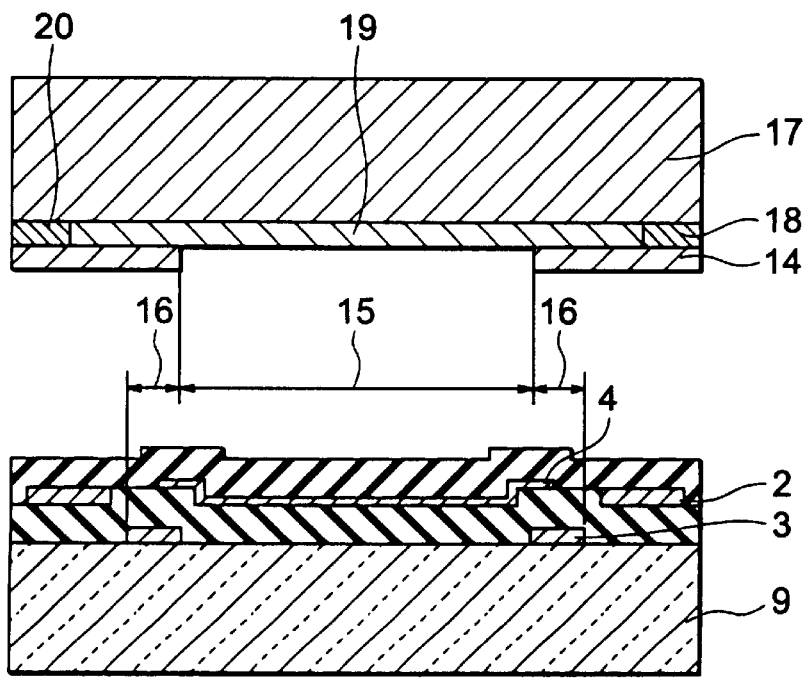
FIG. 15 is an explanatory cross-sectional view showing the role of a light shield film.
Figure 16:
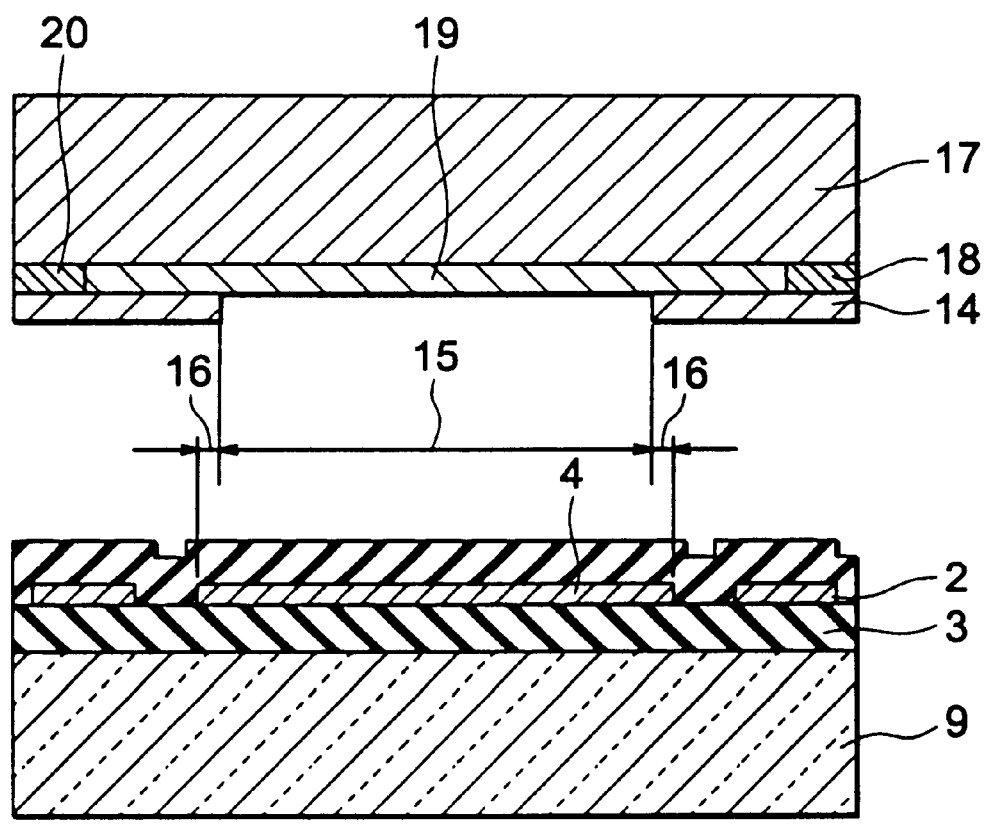
FIG. 16 is an explanatory cross-sectional view showing the role of a light shield film.

As shown in FIG. 15, a typical thin film transistor array is formed by superimposing the transparent insulating substrate 9 for forming TFTs upon a color filter 17 opposing to the transparent insulating substrate 9, on which a color layer a 18, a color layer b 19, a color layer c 20, and a black matrix 14 are formed; and by filling the gap between the transparent insulating substrate 9 and the color filter 17 with liquid crystal.

It is necessary to increase the opening portion 15 of the black matrix 14 in order to improve the opening ratio of a thin film transistor array. Ideally, the opening portion 15 of the black matrix may be preferably expanded until the edge portion of the pixel electrode 4 coincides with the edge portion of the opening portion 15 of the black matrix. However, in practice, a shift may occur in the superimposing process of the transparent insulating substrate 9 with the color filter 17. This requires bringing the opening portion 15 of the black matrix toward the inside of the edge portion of the pixel electrode 4 by 5 to 7 μm in consideration of the shift in the superimposition as shown in FIG. 15. This is disadvantageous from the viewpoint of the opening ratio.

Furthermore, the pixel electrode 4 may be preferably expanded as much as possible in order to improve the opening ratio. However, in the cases where the pixel electrode 4 and the signal line 2 are formed in the same plane on the same gate insulating film 10, a pixel electrode 4 and the signal line 2 located too closely to each other will increase the possibility of occurrence of a short-circuit between both due to pattern deformation or conductive foreign objects of the pixel electrode 4 or the signal line 2. In reality, this requires ensuring a space of approximately 4 to 6 μm between both, thus reducing the opening ratio, as well.

In contrast, consider the case where there is formed the light shielding film 3, comprised of the first conductive film, which is apart from the signal line 2 by a predetermined distance and has an overlap with the edge portion of the pixel electrode 4 via the gate insulating film 10 as shown in FIG. 13, whereby, a shift in superimposition may be considered based on the distance from the edge portion of a side of the signal line 2 of the light shielding film 3, as shown in FIG. 15. In addition, the light shielding film 3 is formed on a plane that is different from that of the signal line 2, so that the space between both can be made as small as around 1 to 2 μm. Accordingly, compared with the case without the light shielding film 3, an effect can be obtained such that the black matrix opening portion 15 is increased and thus the opening ratio is improved.

Next, a correction of an interruption of the signal line 2 in an embodiment of the present invention is to be explained.

Figure 4:
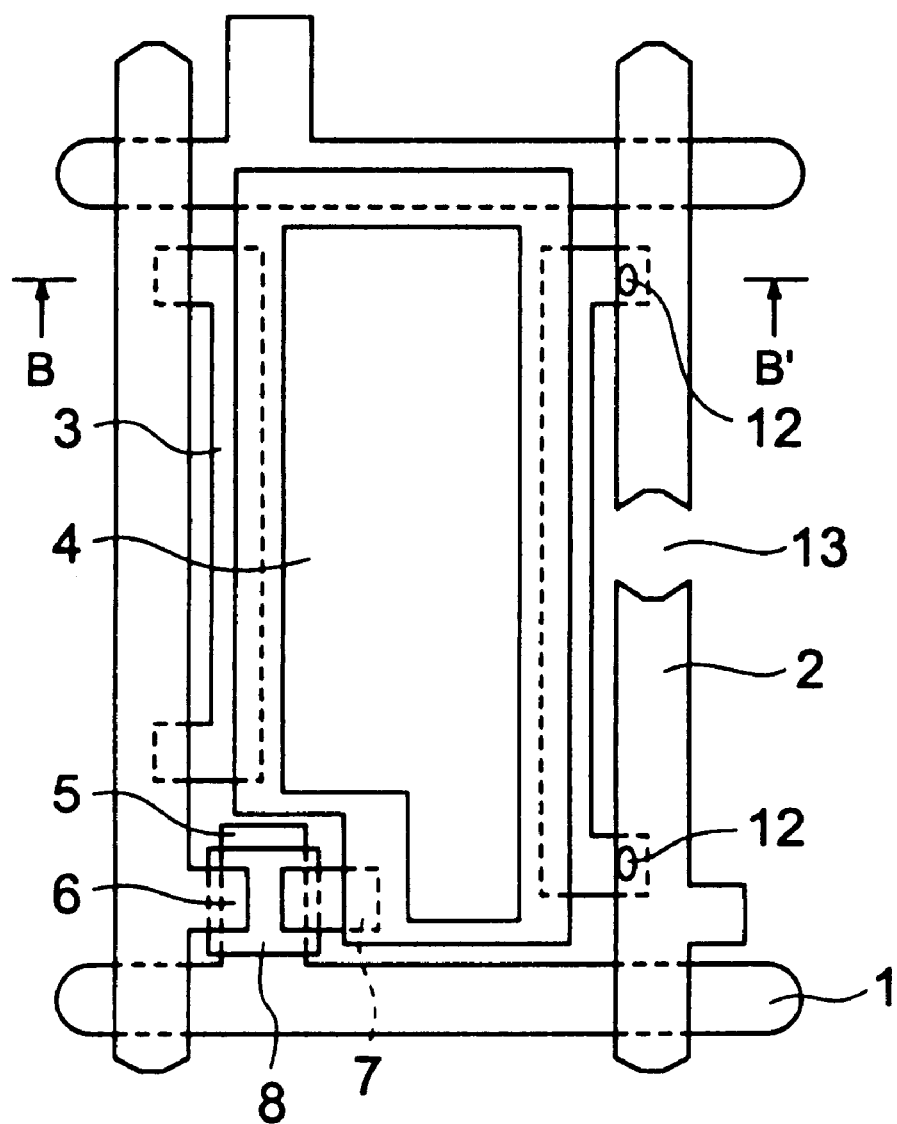
FIG. 4 is an explanatory view showing the state of interruption repairs in the first embodiment of the present invention.
Figure 5:
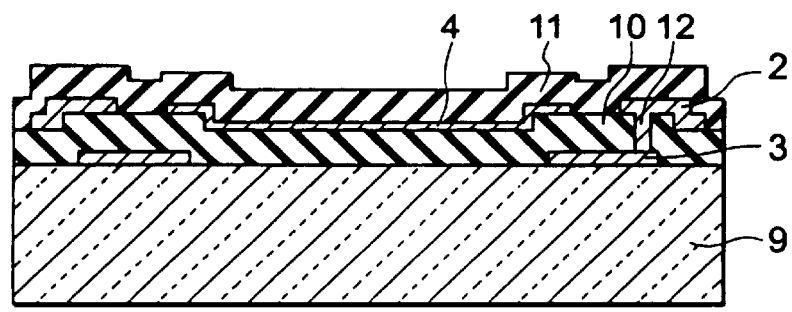
FIG. 5 is a cross-sectional view taken along line B–B' of FIG. 4.

FIG. 4 is a plan view showing a case where an interruption point 13 occurs in the signal line 2 and the correction overlap portions 28 are irradiated with a laser beam to correction the interruption. FIG. 5 is a cross-sectional view taken along line B–B' of FIG. 4.

First, the signal line 2 is checked for an interruption. If there is an interruption, then its position is identified. This is done during the defect detection inspection after the thin film transistor array has been formed. The object of the inspection is to detect a defect of the thin film transistor array, to correction it if it is correctable, and to prevent it from being sent to the subsequent process if not correctable.

Next, in the cases where an interruption in the signal line 2 is detected in this inspection, the two correction overlap portions 28 across the interruption point 13 are irradiated with a laser beam to effectuate a correction.

Furthermore, in this embodiment, a correction of an interruption can be effectuated only when the interruption point 13 in the signal line 2 exists in a region in between the correction overlap portions 28.

In the case where such an interruption is present, the correction overlap portions 28 near both ends of the light shielding film 3 along the signal line 2 are irradiated with a laser beam. As shown in FIG. 4, at the laser-irradiated portions 12, this allows the second conductive film to melt, and the gate insulating film 10 between the first conductive film and second conductive film to be destroyed. Consequently, the first conductive film and the second conductive film are made electrically continuous.

Accordingly, a data signal transmitting along the signal line 2 is bypassed for transmission to the light shielding film 3 via the laser-irradiated portions 12 and thus can be transmitted to the signal line 2 beyond the interruption point 13. Thus, interruptions can be corrected.

Furthermore, in this embodiment, the light shielding film 3 is formed of the first conductive film that forms scanning lines 1 and the like, thus requiring no additional process or the like and, therefore, never adding load to the process.

Still furthermore, the areas of the correction overlap portions 28 between the signal line 2 and the light shielding film 3 can be made smaller. That is, the correction of an interruption by laser irradiation can be effectuated with an area of the correction overlap portion 28 of a few square micrometers, so that the parasitic capacitance between the signal line 2 and the pixel electrode 4 can be made small.

Consequently, an increase in capacitance between wirings, which was a problem in the prior art, can be reduced. Thus, such an effect can be obtained that degradation in display quality will not occur due to an increase in the time constant between wirings.

In addition, likewise, reduced parasitic capacitance between the signal line 2 and the pixel electrode 4 causes the influence of variation in the potential of data signals to decrease, for which the pixel electrode 4 is to be subjected, and thus no degradation in display quality occurs.

The production of a thin film transistor array, according to this embodiment, is to be explained below. FIG. 8 through FIG. 12 show a method for producing the thin film transistor array according to this embodiment.

Figure 8:
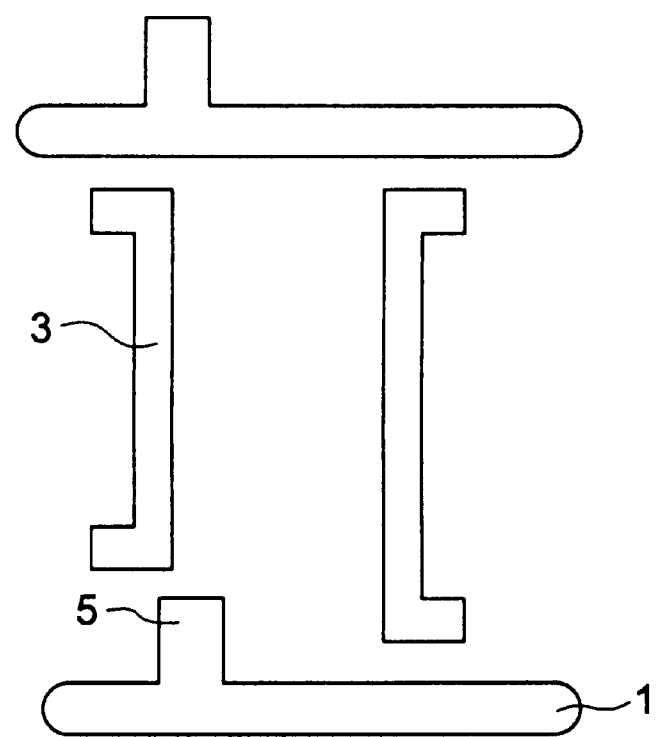
FIG. 8 is an explanatory view showing the production method of the first embodiment of the present invention.

As shown in FIG. 8, on the transparent insulating substrate 9 comprised of glass or the like, the first conductive film is formed by sputtering or the like, and then predetermined patterns such as the scanning lines 1, a gate electrode 5, and the light shielding film 3 are formed by photolithography.

Figure 9:
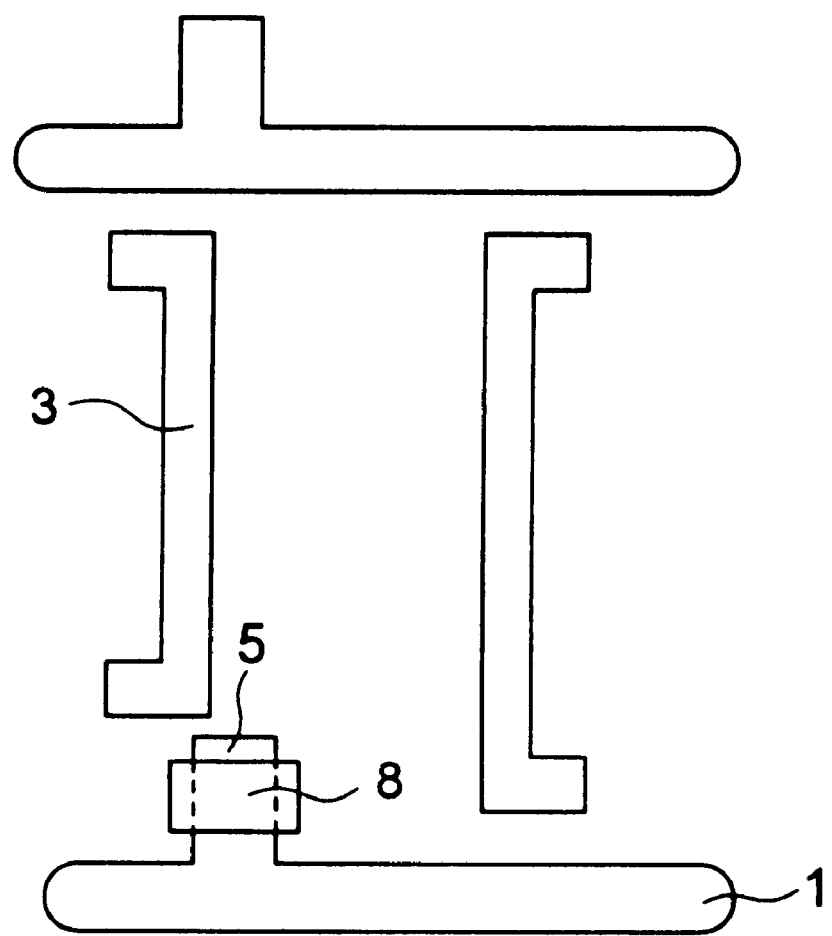
FIG. 9 is an explanatory view showing a process subsequent to that of FIG. 8 in the production method of the first embodiment of the present invention.

Next, as shown in FIG. 9, the gate insulating film 10 (see FIGS. 3, 5 and 7) and the thin film transistor 8 are continuously formed, and then the semiconductor film 8 is formed into a predetermined pattern such as the TFT portion and the like by means of photolithography.

Subsequently, contact holes (not shown) are formed by means of photolithography, which are used for making the first conductive film and the second conductive film electrically continuous.

Figure 10:
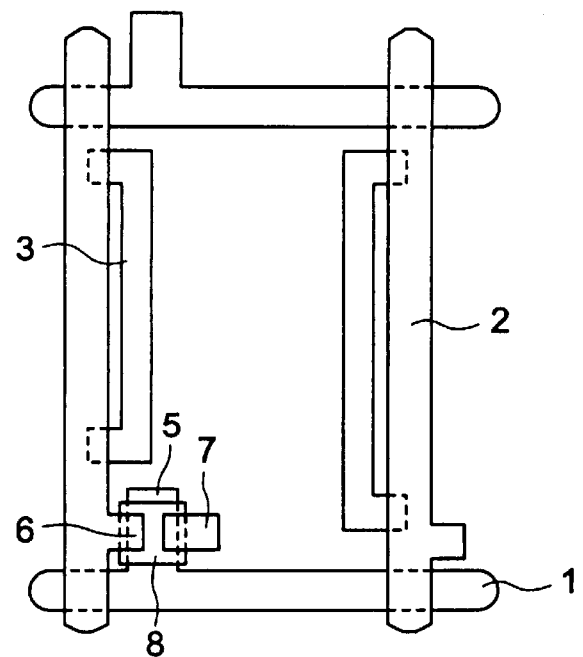
FIG. 10 is an explanatory view showing a process subsequent to that of FIG. 9 in the production method of the first embodiment of the present invention.

Thereafter, as shown in FIG. 10, the second conductive film is formed and then predetermined patterns such as the signal lines 2 are formed by photolithography.

Figure 11:
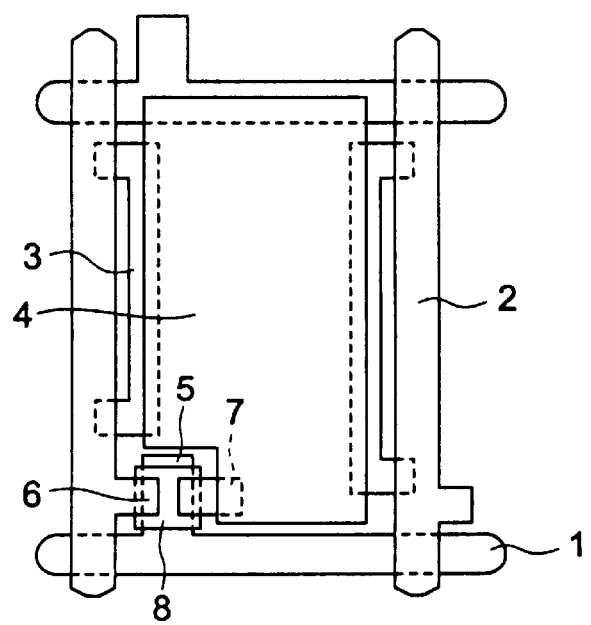
FIG. 11 is an explanatory view showing a process subsequent to that of FIG. 10 in the production method of the first embodiment of the present invention.

Furthermore, as shown in FIG. 11, transparent conductive films such as ITO are formed, and then the pixel electrode 4 and the like are formed by means of photolithography.

Figure 12:
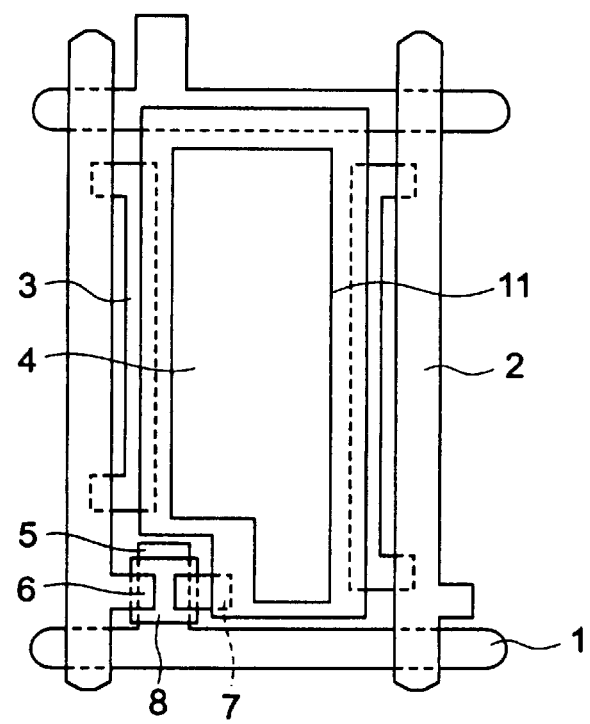
FIG. 12 is an explanatory view showing a process subsequent to that of FIG. 11 in the production method of the first embodiment of the present invention.

Finally, as shown in FIG. 12, a protective film 11 is formed and then the protective film 11 on the predetermined portions such as on the pixel electrode 4 is removed by means of photolithography, and thus the formation of thin film transistors are completed.

Figure 6:
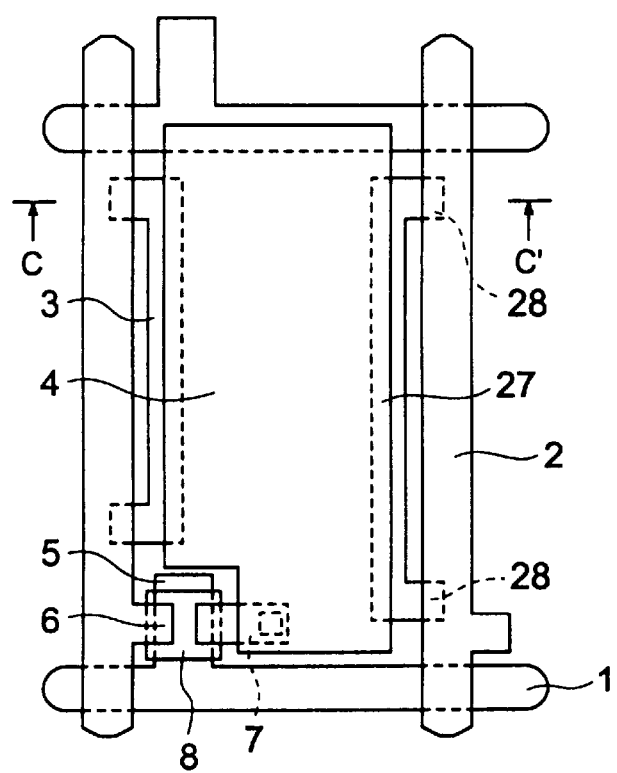
FIG. 6 is a plan view showing the configuration of a second embodiment of the present invention.
Figure 7:
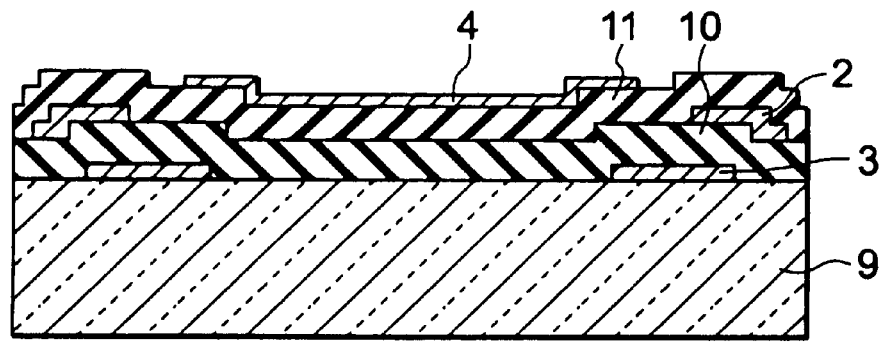
FIG. 7 is a cross-sectional view taken along line C–C' of FIG. 6.

Next, a second embodiment of the present invention is to be explained with reference to the drawings. FIG. 6 is a view showing the configuration of a thin film transistor array comprising a second embodiment of the present invention. FIG. 7 is a cross-sectional view taken along line C–C' of FIG. 6.

In the aforementioned thin film transistor array of the first embodiment, the pixel electrode 4 is formed on the gate insulating film 10. However, in this embodiment, the present invention is applied to a thin film transistor array with the pixel electrode 4 formed on the protective film 11.

Referring to FIG. 6 and FIG. 7, on a transparent insulating substrate 9 comprised of glass or the like, formed are a plurality of scanning lines 1 formed of the first conductive film, the plurality of signal lines 2 formed of the second conductive film, the pixel electrode 4 formed on the protective film 11 in a region enclosed by adjacent scanning lines 1 and adjacent signal lines 2, the thin film transistor 8 coupled to the pixel electrode 4, and light shielding films 3 forming light shield overlap portions 27 which overlap via the gate insulating film 10 and the protective film 11 with outer peripheral portions, facing to the signal lines 2, of each pixel electrode 4 comprised of the first conductive film.

Furthermore, the light shielding films 3 formed of the first conductive film forms light shield overlap portions which overlap via the gate insulating film 10 and the protective film 11 with peripheral portions 27 of the pixel electrode 4 facing the signal lines 2; and the portions near the upper and lower ends of the light shielding film 3 are projected toward the signal line 2, thus forming correction overlap portions 28 which overlap via the gate insulating film 10 with the signal line 2.

In such a configuration, like the aforementioned first embodiment, in case of an interruption in the signal line 2, the correction overlap portions 28 between the light shielding film 3 and the signal line 2 can be irradiated with a laser beam, thereby making the signal line 2 and the light shielding film 3 electrically continuous.

Therefore, even in a case of an occurrence of an interruption in the signal line 2, the overlap portions 28 between the light shielding film 3 and the signal line 2 are irradiated with a laser beam to make both electrically continuous, thereby allowing for supplying data signals to the signal line 2 beyond the interruption. Thus, such an effect is obtained in that an interruption in the signal line 2 can be corrected.

Furthermore, like the aforementioned first embodiment, the light shielding film 3 has two roles: the role of improving the opening ratio of a thin film transistor and of correcting interruptions of the signal line 2.

Still furthermore, in this embodiment, the pixel electrode 4 and the signal line 2 exist on different planes, thereby reducing the possibility of occurrence of a short-circuit between both due to pattern deformation or conductive foreign objects of the pixel electrode 4 or the signal line 2.

Furthermore, since the gate insulating film 10 and the protective film 11 are stacked between the pixel electrode 4 and the light shielding film 3, the thickness of films between both can be made thicker. This leads to reduced parasitic capacitance among the pixel electrode 4, the light shielding film 3, and the signal line 2, and thus allows for preventing degradation in display quality as well.

As mentioned above, in the second embodiment of the present invention, like the aforementioned first embodiment, an interruption can be corrected without an additional process and a thin film transistor array can be formed which is provided with no degradation in display quality.

Furthermore, it is a matter of course that the present invention can be applied to either of the normally staggered TFT or the inversely staggered TFT.

What is claimed is:

1. A thin film transistor array comprising:
a transparent insulating substrate;
a plurality of scanning lines formed of a first conductive film formed on said transparent insulating substrate;
a gate insulating film;
a plurality of signal lines formed of a second conductive film formed on said gate insulating film;
pixel electrodes formed on said gate insulating film in a region enclosed with adjacent scanning lines and adjacent signal lines;
thin film transistors coupled to the pixel electrodes; and
light shielding films forming light shielding overlap portions comprised of the first conductive film and overlapping with peripheral portions facing said signal lines of respective pixel electrodes via said gate insulating film,
said light shielding films forming correction overlap portions overlapping via the gate insulating film with said signal lines, wherein only predetermined regions of said light shielding films, located near both ends thereof along said signal lines, are projected toward said signal lines to form said correction overlap portions for the said signal lines.

2. A thin film transistor array comprising:
a transparent insulating substrate;
a plurality of scanning lines formed of a first conductive film formed on said transparent insulating substrate;
a gate insulating film;
a plurality of signal lines formed of a second conductive film formed on said gate insulating film;
pixel electrodes formed on a protective film on said signal lines and said gate insulating film in a region enclosed with adjacent scanning lines and adjacent signal lines;
thin film transistors coupled to said pixel electrodes; and
light shielding films forming light shielding overlap portions comprised of the first conductive film and overlapping with peripheral portions facing said signal lines of respective pixel electrodes via said protective film;
said light shielding films forming correction overlap portions overlapping via said protective film with said signal lines, wherein only predetermined regions of said light shielding films, located near the both ends thereof along said signal lines, are projected toward said signal lines to form the said correction overlap portions for the said signal lines.

3. A thin film transistor array comprising:
a plurality of scanning lines and a plurality of signal lines, so disposed on a substrate as to intersect one another;
a plurality of thin film transistors provided at intersecting portions of said scanning lines and said signal lines, each of which is interposed between said signal line and a pixel electrode, and a gate wherein each of which is coupled to each of said scanning lines; and
conductive films, each of which forms a light shielding overlap portion which overlaps via an insulating film a rim portion of said pixel electrode opposing each of said signal lines, and each of which has a plurality of extensions which are projected toward a side of each of said signal lines at a plurality of portions disposed apart from one another along said signal lines and extend beyond an edge of said side of each of said signal lines,
wherein each of said extensions of said light shielding films overlaps each of said signal lines in part via said insulating film to form a correction overlap portion,
said thin film transistor array adapted such that, in cases where an interruption occurs in said signal lines, said interruption can be corrected by making said correction overlap portion between said light shielding film and said signal line short-circuited and thus electrically continuous by bypassing the interruption portion of said signal line.

4. A thin film transistor array comprising:

a transparent insulating substrate;

a plurality of scanning lines formed of a first conductive film formed on said transparent insulating substrate;

a plurality of signal lines formed of a second conductive film;

pixel electrodes formed on a gate insulating film in a region enclosed with adjacent scanning lines and adjacent signal lines;

thin film transistors coupled to the pixel electrodes; and light shielding films forming light shielding overlap portions comprised of the first conductive film and overlapping with peripheral portions facing said signal lines of respective pixel electrodes via said gate insulating film, said light shielding films forming correction overlap portions overlapping via the gate insulating film with said signal lines, wherein only predetermined regions of said light shielding films, located near both ends thereof along said signal lines, are projected toward said signal lines to form said correction overlap portions for said signal lines.

5. A thin film transistor array comprising:

a transparent insulating substrate;

a plurality of scanning lines formed of a first conductive film formed on said transparent insulating substrate;

a plurality of signal lines formed of a second conductive film;

pixel electrodes formed on a protective film in a region enclosed with adjacent scanning lines and adjacent signal lines;

thin film transistors coupled to said pixel electrodes; and light shielding films forming light shielding overlap portions comprised of the first conductive film and overlapping with peripheral portions facing said signal lines of respective pixel electrodes via said protective film, said light shielding films forming correction overlap portions overlapping via said protective film with said signal lines, wherein only predetermined regions of said light shielding films, located near both ends thereof along said signal lines, are projected toward said signal lines to form said correction overlap portions for said signal lines.

6. A thin film transistor array comprising:

a plurality of scanning lines formed of a first conductive film formed on a transparent insulating substrate;

a plurality of signal lines formed of a second conductive film;

pixel electrodes formed on a gate insulating film in a region enclosed with adjacent scanning lines and adjacent signal lines; and light shielding films forming light shielding overlap portions comprised of the first conductive film and overlapping with peripheral portions facing said signal lines of respective pixel electrodes via said gate insulating film, said light shielding films forming correction overlap portions overlapping via the gate insulating film with said signal lines, wherein only predetermined regions of said light shielding films, located near both ends thereof along said signal lines, are projected toward said signal lines to form said correction overlap portions for said signal lines.

7. A thin film transistor array comprising:

a transparent insulating substrate;

a plurality of scanning lines formed of a first conductive film formed on said transparent insulating substrate;

a plurality of signal lines formed of a second conductive film;

pixel electrodes formed on a protective film in a region enclosed with adjacent scanning lines and adjacent signal lines; and light shielding films forming light shielding overlap portions comprised of the first conductive film and overlapping with peripheral portions facing said signal lines of respective pixel electrodes via said protective film, said light shielding films forming correction overlap portions overlapping via said protective film with said signal lines and said light shielding films having such a shape that, when an interruption occurs in said signal lines, said interruption can be corrected on one of said signal lines by making said correction overlap portion between said light shielding film and said signal line short-circuited and thus electrically continuous by bypassing the interruption portion of said signal line, said correction occurring only by using both of two predetermined regions of said signal line, said two predetermined regions located on the signal line at each of the two ends of each said enclosed pixel electrode.

* * * * *